United States Patent
Candelier

(10) Patent No.: US 6,351,407 B1
(45) Date of Patent: Feb. 26, 2002

(54) DIFFERENTIAL ONE-TIME PROGRAMMABLE MEMORY CELL STRUCTURE IN CMOS TECHNOLOGY

(75) Inventor: Philippe Candelier, Saint Mury Monteymond (FR)

(73) Assignee: STMicroelectronics S.A., Gentilly (FR)

(*) Notice: Subject to any disclaimer, the term of this patent is extended or adjusted under 35 U.S.C. 154(b) by 0 days.

(21) Appl. No.: 09/470,893

(22) Filed: Dec. 22, 1999

(30) Foreign Application Priority Data

Dec. 23, 1998 (FR) .............................. 98 16583

(51) Int. Cl.[7] .............................................. G11C 11/24
(52) U.S. Cl. ...................................... 365/149; 365/102
(58) Field of Search ................................. 365/149, 102, 365/104, 96, 225.7, 185.05

(56) References Cited

U.S. PATENT DOCUMENTS

| 5,426,614 A | 6/1995 | Harward .................. 365/225.7 |
| 5,712,577 A | 1/1998 | Cho ............................. 326/38 |
| 5,815,429 A * | 9/1998 | Sher ............................. 365/96 |
| 5,835,402 A | 11/1998 | Rao et al. .................. 365/149 |

* cited by examiner

*Primary Examiner*—A. Zarabian
(74) *Attorney, Agent, or Firm*—Lisa Jorgenson; E. Russell Tarleton; SEED IP Law Group PLLC

(57) ABSTRACT

An OTP memory integrated circuit in CMOS technology, including at least two oxide capacitors forming a differential reading storage element, and a read and programming circuit in which the transistors of a first conductivity type are adapted to being used both during read cycles under a relatively low voltage and during programming cycles under a relatively high voltage.

7 Claims, 2 Drawing Sheets

US 6,351,407 B1

DIFFERENTIAL ONE-TIME PROGRAMMABLE MEMORY CELL STRUCTURE IN CMOS TECHNOLOGY

TECHNICAL FIELD

The present invention relates to the field of one-time programmable (OTP) non-volatile memory cells, which are likely to keep a programmed state even after the circuit is powered off. The present invention more specifically relates to a differential structure of memory cells, each made from an oxide capacitor.

BACKGROUND OF THE INVENTION

An example of application of OTP cells is the formation of redundancy elements, which are generally provided in memories made in the form of one or several integrated circuit arrays, to functionally replace a defective memory element. The function of the OTP cells then is to program the shifting of the memory rows or columns upon use of a redundancy element to overcome the failure of a column or a row of the array.

In this type of application, either elements fusible, for example, by laser, or OTP memory cells of EEPROM type or of floating-gate transistor type are used. All these conventional structures have the major disadvantage of not being compatible with simple CMOS manufacturing methods. In particular, non-volatile EPROM-type memory cells require two gate oxide thicknesses while a standard CMOS manufacturing method only uses one.

In a standard CMOS method, after forming source and drain regions of P-channel and N-channel MOS transistors in a silicon substrate, a single oxide layer (generally, silicon oxide) and a single polysilicon layer are deposited to form the transistor gates before the metallization levels.

Polysilicon fusible structures are also known, however, which require a strong programming current to obtain the fusion (on the order of 100 mA).

The category of OTP cells to which the present invention applies is generally called an "anti-fuse" structure since the unprogrammed state of the cell is a state of isolation of two electrodes and its programmed state is a state of current flow. The cells are, more specifically, formed of a capacitor formed of an oxide thickness likely to be made conductive (to break down) after application of an overvoltage between the two capacitor electrodes.

A problem which arises in the making of such an oxide breakdown structure with a standard CMOS method is linked to the switching of the high voltage required to break down the capacitors. Indeed, standard transistors cannot switch this high voltage without being, themselves, in a breakdown state.

For example, in a technology where the minimum dimension of a mask pattern is 0.25 µm, the supply voltage of the CMOS circuits generally is on the order of 2.5 V, while an oxide breakdown OTP cell requires on the order of 10 V for an oxide having a thickness on the order of 5 nm, which is the usual thickness of the gate oxide in this technology.

If such a 10-V voltage generally is available on the integrated circuit boards for which the memory integrated circuits are intended, this voltage is not compatible with addressing selection structures and memory input-output stages, the operating voltage of which is linked to the CMOS method used.

The reading of the content of the memory cells is, however, performed under a low CMOS voltage (for example, 2.5 V). This conventionally results in a need for distinct programming and read circuits due to the very different voltages carried by these circuits. Such distinct circuits are prejudicial to the bulk reduction generally desired for integrated memory circuits.

SUMMARY OF THE INVENTION

The present invention aims at providing a novel differential structure of OTP memory cells, which overcomes the disadvantages of conventional solutions.

The present invention more specifically aims at providing such a differential structure in which the same elements are used, both for the cell programming and reading.

The present invention further aims at providing a structure which is compatible with standard CMOS methods. In particular, the present invention aims at providing a solution which requires no additional step with respect to a conventional CMOS method.

One embodiment of the present invention provides an OTP memory integrated circuit in CMOS technology, including at least two oxide capacitors connected via an unbalanced read transistor to an output stage and forming a differential reading storage element, and a read and programming circuit in which transistors of a first conductivity type are adapted to being used, both during read cycles under a relatively low voltage and during programming cycles under a relatively high voltage, the read transistor being turned on only during read cycles.

According to an embodiment of the present invention, the programming and read circuit includes at least two unbalanced programming transistors of the second conductivity type, the respective drains of which are connected to a first terminal of the capacitors, respectively.

According to an embodiment of the present invention, the programming transistors are, each, associated in series with at least two transistors of the first conductivity type to form at least two first parallel branches between a first supply terminal and the ground, the source of an upper transistor of each branch being connected to the first terminal.

According to an embodiment of the present invention, a second transistor of the first conductivity type of each branch, interposed between the first transistor and the programming transistor, is connected to a terminal of application of an intermediary voltage, smaller than the voltage applied on the first supply terminal.

According to an embodiment of the present invention, the programming and read circuit includes at least two parallel secondary branches, each including, in series between the terminal of application of the intermediary voltage and the ground, at least two transistors of the first conductivity type and one unbalanced programming transistor of the second conductivity type, said first branches including, each, at least three transistors of the first conductivity type.

According to an embodiment of the present invention, the programming transistors are off during read cycles.

According to an embodiment of the present invention, the programming transistors are controlled by complementary signals during a programming cycle.

The foregoing features and advantages of the present invention, will be discussed in detail in the following non-limiting description of specific embodiments in connection with the accompanying drawings.

DETAILED DESCRIPTION OF THE INVENTION

Figure 1:
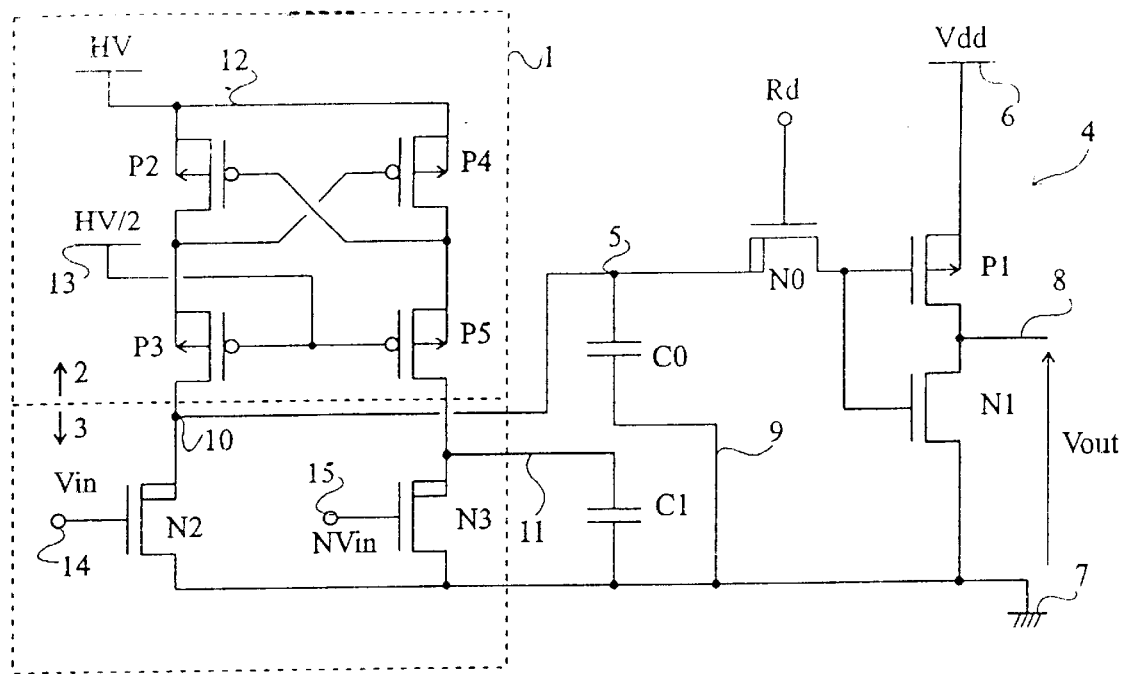
FIG. 1 shows a first embodiment of an integrated structure of OTP memory cells according to the present invention, provided with a first embodiment of a programming and read circuit.

The same elements have been designated by the same references in the different drawings. For clarity, only those elements which are necessary to the understanding of the present invention have been shown in the drawings and will be described hereafter. In particular, although memory cells according to the present invention may be arranged in an array sharing a same programming and read circuit, the present invention will be described hereafter in relation to a single pair of cells operating in a differential way.

FIG. 1 shows a first embodiment of a differential OTP memory cell structure according to the present invention.

Such a structure essentially includes two capacitors C0, C1, of storage in differential form, of the data to be non-volatilely stored. These capacitors are oxide capacitors, that is, formed by an oxide thickness (generally, silicon oxide) also constitutive of the gates of the transistors of the CMOS integrated circuit in which the capacitors are integrated.

Capacitors C0 and C1 are associated with a programming and read control circuit 1 formed, essentially, of an upper half-stage 2 based on MOS transistors of a first conductivity type (here, P-channel transistors) and of a lower half-stage 3 based on MOS transistors of a second conductivity type (here, N-channel transistors).

According to the present invention, the N-channel transistors (of the second type) are unbalanced, that is, their respective drains are formed of a region less doped or thicker than the source. Preferably, this drain region is formed simultaneously with the conventional step of forming a well (Nwell) of same conductivity type as the channel, the source remaining formed by a more reduced region (than the drain) like the sources and drains of the other transistors of the conventional CMOS integrated circuit. This feature of the present invention will be better understood hereafter in relation with FIG. 3. For the time being, it should only be noted that the use of unbalanced transistors enables the latter to withstand, in the off state, a high voltage (greater than 10 V) between their drain and source, even when these transistors are made in CMOS technology.

One of the two capacitors (here, for example, capacitor C0) is associated with an output stage 4 formed, mainly, of an unbalanced MOS transistor N0 (for example, an N-channel transistor). The drain of transistor N0 is connected to a first terminal 5 of capacitor C0 and its source is connected to the gates of two MOS transistors, respectively a P-channel transistor T1 and an N-channel transistor N1, associated in series between a terminal 6 of application of a CMOS supply voltage Vdd (for example, 2.5 V) and ground 7. The junction point 8 of transistors P1 and N1 forms the output terminal of the differential cell according to the present invention, providing a logic output voltage V out.

First terminal 5 of capacitor C0 is also connected to a first output terminal 10 of circuit 1 while a second terminal 9 of capacitor C0 is connected to ground 7. Capacitor C1 is connected between a second complementary output terminal 11 of circuit 1 and ground 7.

According to the present invention, programming and read control circuit 1 is intended to be supplied by several voltages, the greatest voltage HV being chosen to enable a breakdown of the oxide of capacitors C0 and C1.

A feature of the present invention is to provide a programming circuit 1 which, while being formed by means of a conventional CMOS manufacturing method and, in particular, without using additional oxide thicknesses, can operate under a relatively higher voltage HV than supply voltage Vdd of the CMOS circuit.

The function of N-channel unbalanced transistor N0, the gate of which receives a read control signal Rd to activate the transfer of the content of the OTP cell to output stage 4, is to isolate, during cell programming periods, the output stage and the rest of the CMOS circuit from high voltage HV provided by programming circuit 1.

In the embodiment illustrated in FIG. 1, circuit 1 is formed of two parallel branches, each including, in series between a supply terminal 12 and ground 7, two P-channel MOS transistors and one unbalanced N-channel MOS transistor.

According to the present invention, the P-channel MOS transistors which are, in this example, the transistors formed in wells, have the feature of having, individually, their well connected to their drain. This enables avoiding for any P-channel transistor of the circuit to see, between two of its connections (drain, source, gate, well), a voltage greater than voltage Vdd. Advantage is here taken from the fact that although, in a conventional P-channel CMOS transistor, the withstandable voltage between any two connections of the transistor is limited to a few volts, the voltage between the well and the circuit ground can be much greater (more than 10 V). In practice, this results in individualizing the N-type wells of the P-channel transistors formed in a P substrate.

Thus, a first branch of circuit 1 includes, in its upper stage, two P-channel MOS transistors P2, P3 and one N-channel MOS transistor N2. The source of transistor P2 is connected to terminal 12, its drain is connected to the source of transistor P3, the drain of which is connected to the drain of transistor N2 and forms output terminal 10 of circuit 1, the source of transistor N2 being connected to ground 7. A second branch of circuit 1 includes two P-channel MOS transistors P4, P5 and one unbalanced N-channel MOS transistor N3 between terminals 12 and 7. The source of transistor P4 is connected to terminal 12, its drain is connected to the source of transistor P5, the drain of which is connected to the drain of transistor N3 and forms terminal 11 towards capacitor C1, the source of transistor N3 being connected to ground 7. The gates of transistors P2 and P4 are cross coupled to the drains, that is, the gate of transistor P2 is connected to the drain of transistor P4 while the gate of transistor P4 is connected to the drain of transistor P2. The gates of transistors P3 and P5 are connected together at a terminal 13 of application of an intermediary voltage (for example, HV/2) between the supply voltage (for example, HV) applied on terminal 12 and the ground.

The function of the intermediary voltage is to bias transistors P3 and P5 while fulfilling, during programming cycles where supply voltage HV is a "high" voltage (for example, 10 V), the condition of not applying too high a voltage across the P-channel MOS transistors.

Gates 14, 15 of respective transistors N2 and N3 receive complementary control signals which, according to the present invention, differ according to whether circuit 1 is in a programming or read cycle. Similarly, according to the present invention, the voltages applied on terminals 12 and 13 differ according to whether the cell has to be programmed or read. Thus, it should be noted that although, for simplification, terminals 12 and 13 have been associated with potentials HV and HV/2 in FIG. 1, these are the voltages applied in a programming cycle. In a read cycle, the voltage applied on terminal 12 preferably corresponds to voltage Vdd of supply of the rest of the CMOS circuit. The voltage applied on terminal 13 then corresponds to half this voltage Vdd.

The operation of a differential OTP memory cell structure according to the present invention illustrated by FIG. 1 is the following.

In a programming cycle, that is, when one of capacitors C0 or C1 has to break down, capacitor C0 is isolated from output stage 4 by the blocking of transistor N0 by means of a signal Rd at low level (ground). Signals Vin and NVin respectively applied on terminals 14 and 15 are, in a programming cycle, complementary to the condition of capacitors C0 or C1 which has to break down.

Circuit 1 can be assimilated to a logic level step-up circuit, that is, a circuit adapted to transforming a logic level Vin or NVin in CMOS amplitude into a much higher logic voltage level (for example, on the order of 10 V) corresponding to voltage HV, on one of output terminals 10 or 11.

Assume that signal Vin is high, thus turning on transistor N2. High voltage HV then is present between terminals 12 and 10. The midpoint of this series association thus substantially is at potential HV/2 Since transistor P3 receives voltage HV/2 on its gate, it cannot be turned on. Transistors P2 and P3 are thus blocked. On the second branch side, transistor N3 is blocked by a low signal NVin and transistors P4 and P5 are on, the gate of transistor P4 being at a potential smaller than the potential of gate 12 and the gate of transistor P5 seeing a voltage HV/2 smaller than voltage HV present on its source.

It should be noted that, in the present description, the series voltage drops of the on transistors are neglected to simplify the explanation of the different voltages.

As a result, capacitor C1 sees the high voltage (on the order of 10 V) across its terminals, which results in breaking down the oxide forming it.

Preferably, in a programming cycle and after selecting the transistor N2 or N3 which is on, a voltage ramp is applied on terminal 12 (and also on terminal 13). This voltage step is chosen to be sufficiently fast to avoid damaging the P-channel MOS transistors which, in the case of a voltage HV on the order of 10 V, see during the time required for the programming a voltage much greater than CMOS voltage Vdd. The duration of application of this programming voltage HV is chosen to be sufficiently short while enabling the breakdown of the oxide of the selected capacitor.

Once the differential cell has been programmed, terminal 12 is intended for receiving voltage Vdd from the rest of the CMOS circuit to enable the reading of the data. In practice, in most applications, the programming by means of a significant voltage ramp is performed during manufacturing end tests or at a first use. Afterwards, circuit 1 is thus generally only supplied by voltage Vdd.

During a read cycle, transistors N2 and N3 are, according to the present invention, both blocked to isolate capacitors C0 and C1 from the ground. Accordingly, signals Vin and NVin of terminals 14 and 15 are now no longer complementary, but identical and at the low level. It should be noted that one of capacitors C0 or C1 which has broken down is then used as a lower half-stage for bringing one of the branches of circuit 1 to the ground.

Once terminal 12 has been biased by a voltage Vdd and terminal 13 has been biased by a voltage Vdd/2, transistor N0 is turned on to cause the reading by output stage 4.

Assuming that capacitor C1 has broken down during the programming cycle, capacitor C0 is charged by the turning-on of transistor P2 and P3 and the state read for the cell is a high state. The voltage on terminal 12 is thus reproduced on terminal 5, then on the gates of transistors P1 and N1. Output stage 4 shown in FIG. 1 being an inverter stage, restored logic output level Vout is a low level.

If, conversely, capacitor C0 has broken down during the programming cycle, terminal 5 is brought to the ground, transistors P2 and P3 being blocked while transistors P4 and P5 are on. As a result, output voltage Vout provides a high level substantially corresponding to voltage Vdd.

It should be noted that the current difference between two capacitors C0 and C1 must cover the differences due to technological dispersions and to the imbalance of the branches of circuit 1.

It should also be noted that the more series-connected transistors are included in the programming structure, the less these transistors will be stressed during the programming, but the greater the voltage to be applied on terminal 12 must be for the reading.

According to the present invention, a compromise is found between, on the one hand, the stress that the P-channel MOS transistors of the reading and programming circuit are likely to withstand and, on the other hand, the read voltage (Vdd) that the entire circuit can withstand during the rest of the operation.

Thus, the embodiment illustrated in FIG. 1 may be chosen, for example, if the P-channel MOS transistors are likely to withstand the current stress enabling the breakdown of the oxide capacitors even though they are supplied by a voltage HV on the order of 10 V. It should be noted that the time required to break down capacitors C0 and C1 substantially affects the possibility of using a circuit 1 such as illustrated in FIG. 1. An advantage of the embodiment of FIG. 1 is that, in the read mode, a conventional CMOS voltage (for example, on the order of 2.5 V) is sufficient.

For the case where the stress undergone by the P-channel MOS transistors of circuit 1 is considered as being too much, a second embodiment of the programming and read circuit may be used. This second embodiment is illustrated by FIG. 2, which only shows programming and read circuit 1', the remaining elements being the same as in FIG. 1.

Figure 2:
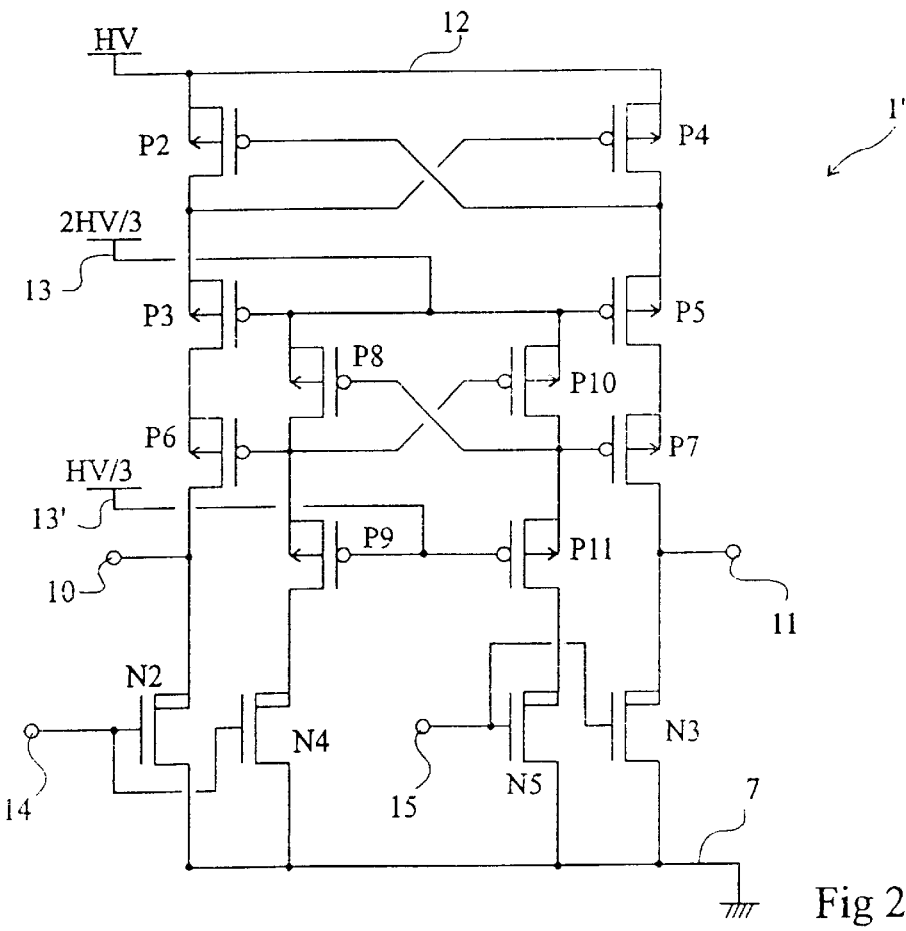
FIG. 2 shows a second embodiment of a programming and read circuit of a differential memory structure according to the present invention.

FIG. 2 shows a second embodiment of a programming and read circuit 1' according to the present invention. The embodiment of FIG. 2 illustrates the case where it is desired to limit, to one third of high programming voltage HV, the voltage across each P-channel transistor (of the first conductivity type), formed in a well.

Thus, in the embodiment of FIG. 2, circuit 1' includes two input terminals 13, 13' adapted to receiving intermediary voltages with respect to the voltage applied on supply terminal 12. Terminal 13 is intended for receiving a voltage substantially corresponding to two thirds (for example, 2HV/3) of the supply voltage. Terminal 13' is intended for receiving a voltage corresponding to one third (for example, HV/3) of the supply voltage.

As in the first embodiment, the output stage includes, between terminals 12 and 7, two parallel branches formed, each, of P-channel MOS transistors, the respective wells of which are individually connected to the respective sources, and of an N-channel unbalanced MOS transistor. In the embodiment of FIG. 2, each branch includes three P-channel MOS transistors, respectively P2, P3, P6 and P4, P5, P7, in series between terminal 12 and, respectively, terminal 10 and terminal 11.

As in the first embodiment, the gates of transistors P2 and P4 are cross coupled to the drains, that is, the gate of transistor P2 is connected to the drain of transistor P4 and the gate of transistor P4 is connected to the drain of transistor P2. Further, the gates of transistors P3 and P5 are connected together to terminal 13'.

However, in the embodiment of FIG. 2, the level (2HV/3) of terminal 13 corresponds, during a programming cycle, to too high a level for the P-channel transistors. Accordingly, a similar structure is reproduced to limit the voltage between any two connections of each of transistors P3, P5, P6, P7, to an acceptable level here chosen to correspond to one third of voltage HV.

Thus, two additional parallel branches are provided between terminal 13 and ground 7. A first branch is formed of two P-channel MOS transistors P8, P9 and of one N-channel MOS transistor N4, series-connected between terminal 13 and terminal 7. A second branch is formed of two P-channel transistors P10, P11, and of one N-channel transistor N5, series-connected between terminals 13 and 7. The respective sources of transistors P8 and P10 are connected to terminal 13 while their respective drains are connected to the respective sources of transistors P9 and P11. The gates of transistors P8 and P10 are crossed. Thus, the gate of transistor P8 is connected to the drain of transistor P10, and the gate of transistor P10 is connected to the drain of transistor P8. The respective drains of transistors P9 and P11 are connected to the respective drains of transistors N4 and N5, the respective sources of which are connected to terminal 7. The respective gates of transistors N4 and N5 receive, like the respective gates of transistors N1 and N2, signal Vin (transistors N1 and N4) or signal NVin (transistors N2 and N5) by being respectively connected to terminals 14 and 15. The gates of transistors P9 and P11 are connected together to terminal 13'. The respective gates of transistors P6 and P7 are connected to the respective drains of transistors P8 and P10, which enables their biasing.

The operation of a circuit such as described in relation with FIG. 2 can be deduced from the operation described in relation with FIG. 1.

An advantage of the embodiment of FIG. 2 is that by applying, upon programming cycles, a voltage HV of 10 V, the individual voltage seen by the different P-channel MOS transistors is smaller than in the first embodiment. However, this second embodiment has the constraint of requiring, in the read mode, a voltage (on the order of 4 V) greater than that required in the first embodiment. This read supply voltage is conditioned by the threshold voltages in series between terminals 12 and 7.

Figure 3:
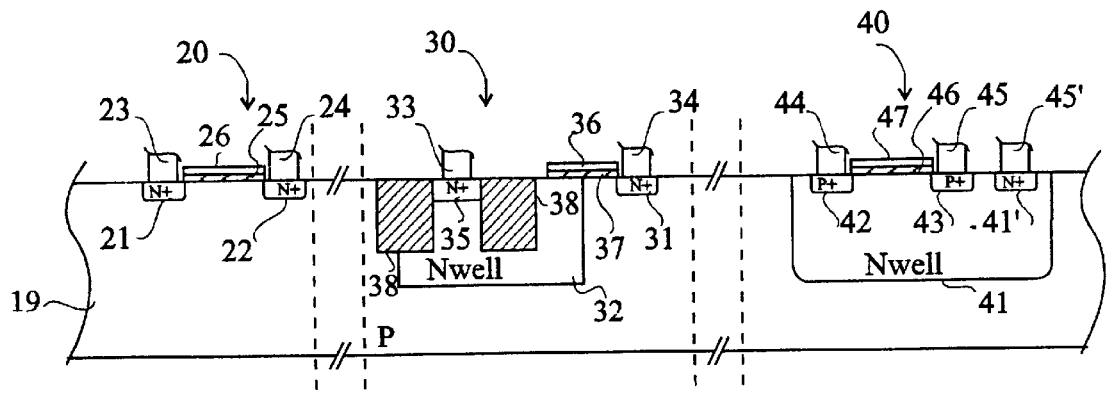
FIG. 3 illustrates, in a cross-sectional view, an example of a structure of the different MOS transistors of a memory circuit according to the present invention.

FIG. 3 shows, in a simplified symbolic cross-section view, an example of structure of the different transistors used in a circuit according to the present invention based on a P-type substrate 19. This drawing shows, in its left-hand portion, the structure of an N-channel MOS transistor 20 in conventional CMOS technology. This is, in the circuit of the present invention, transistor N1 of output stage 4. The central portion of FIG. 3 shows an embodiment of an unbalanced N-channel MOS transistor 30 according to the present invention. The right-hand portion of FIG. 3 shows an example of structure 40 of the P-channel MOS transistors of the circuit of the present invention.

Conventional N-channel transistor 20 is formed of $N^+$-doped drain regions 21 and source regions 22 on which may be taken drain contacts 23 and source contacts 24 formed, for example, by vias connecting regions 21 and 22 to upper metallization levels (not shown). The gate is formed of an oxide level 25 topped with a polysilicon contact 26. In FIG. 3, the source and drain contacts have been symbolized by partially shown vias towards upper levels not shown.

N-channel MOS transistors 30 are formed of $N^+$-doped source regions 31. However, according to the present invention, their respective drains 32 are formed of a region less doped and thicker than the source. Hereafter, conventionally, drain and source contact regions 33 and 34 are formed according to connection needs, respectively on a region 35 (more heavily doped than well 32) and region 31. A gate 36 is made in polysilicon by being separated from substrate 19 by a gate oxide level 37. In the example of FIG. 3, the region 35 is separated from the channel under the gate 36 by a trench 38 filled with an oxide. The gate 36 helps in encoding the access resistance of the transistor.

P-channel transistors 40 are formed in N-type wells 41 formed in substrate 19. Inside wells 41, $P^+$-doped drain and source regions 42, 43 are formed. Drain and source contacts 44 and 45 are, if necessary, formed to the upper levels. Gates 47 of the transistors are formed in a polysilicon level on an oxide level.

According to the present invention, all P-channel MOS transistors 40 have their respective sources 43 connected to their well. This is done, for example, by means of an $N^+$-doped region 41' in well 41, connected (for example, by a contact via 45') to the same metallization level as drain contact area 45.

It should be noted that the unbalanced transistors of the present invention can be formed with a conventional CMOS manufacturing method and, in particular, without requiring any additional step. Indeed, drain wells 32 of the N-channel unbalanced transistors can be formed at the same time as wells 41 of the P-channel MOS transistors. According to the present invention, the mask of formation of the N-type wells is simply adapted to provide the drains of the unbalanced N-channel MOS transistors.

Thus, an advantage of the present invention is that it requires no additional step with respect to a conventional CMOS method.

Figure 4:
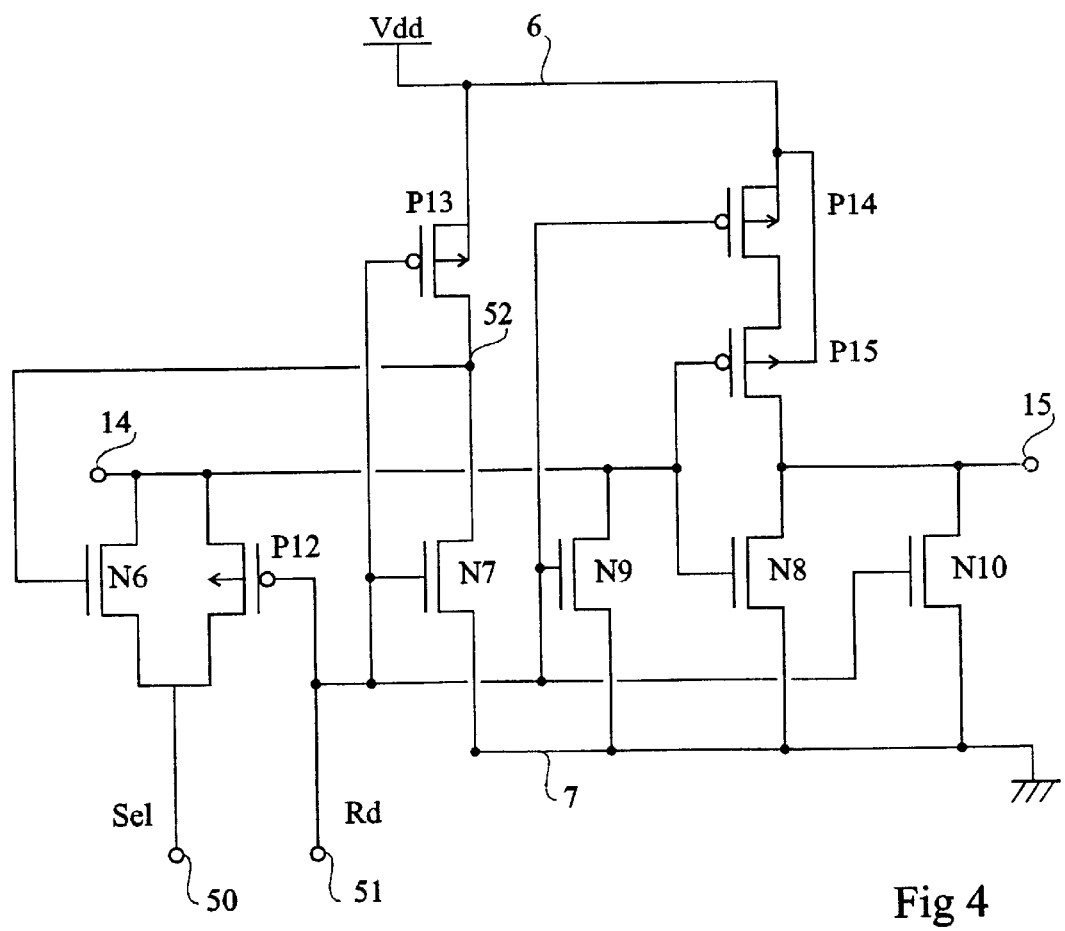
FIG. 4 shows an embodiment of a circuit for controlling transistors of a lower stage of a programming and read circuit according to the present invention.

FIG. 4 shows an embodiment of a control circuit of the N-channel MOS transistors (N2, N3, FIG. 1) of a lower half-stage 3 of a circuit according to the present invention. This circuit is intended for providing, on terminals 14 and 15 adapted to being connected to the gates of transistors N2 and N3, signals Vin and NVin. As previously indicated, these signals must, in a programming cycle, be complementary and, in a read cycle, both be at the low state to block the N-channel transistors of the lower stage of circuit 1.

The control circuit illustrated in FIG. 4 receives, as an order, a selection signal Sel on a terminal 50 to choose, during the read cycle, that of the transistors which has to be on. The circuit also receives, on a second input terminal 51, a signal indicative of a read cycle. It may be, for example, signal Rd applied on the gate of transistor N0 of FIG. 1, or a different signal.

The circuit of FIG. 4 is supplied from the CMOS circuit voltage, for example, voltage Vdd of 2.5 V.

Terminal 50 is connected to the sources of two transistors, respectively a P-channel transistor P12 and an N-channel transistor N6, the drains of which are connected together to terminal 14. The gate of transistor P12 receives signal Rd, and is thus connected to terminal 51, signal Rd being assumed to be active (signaling a read cycle) in the high state. The gate of transistor N6 receives the inverse of signal Rd. The inversion of signal Rd is performed by means of a CMOS inverter formed of a P-channel transistor P13 and of an N-channel transistor N7, series-connected between terminal 6 of application of voltage Vdd and ground 7. The source of transistor P13 and its well are connected to terminal 6 while its drain is connected to the drain of transistor N7, the source of which is connected to ground 7. The gates of transistors P13 and N7 receive signal Rd by being connected to terminal 51. The junction point 52 of transistors P13 and N7 is connected to the gate of transistor N6.

First assume that signal Sel of terminal 50 is low (to the ground). In this case, if signal Rd is high, transistor P12 is off (positive gate-source voltage) and transistor N6 is also off (null gate-source voltage). If signal Rd is low, transistor P12 is still off since its gate-source voltage is zero. However, transistor N6 is on and the low state of terminal 50 is transmitted to terminal 14.

Now assume that signal Sel is high (at Vdd). In this case, if signal Rd is high, transistor P12 is off (null gate-source voltage) and transistor N6 is also off since its gate-source voltage is negative. If signal Rd is low, transistor P12 is on and transmits the high state of terminal 50 to terminal 14 while transistor N6 is off.

Thus, the information present on terminal 40 is transmitted to terminal 14 only if signal Rd is inactive.

The state of terminal 14 is inverted by means of a series association of two P-channel MOS transistors P14 and P15 and of one N-channel MOS transistor N8. The source of transistor P14 is connected to terminal 6 while its drain is connected to the source of transistor P15, the drain of which is connected to the drain of transistor N8, which has its source connected to terminal 7. The junction point of transistor P15 and transistor N8 forms terminal 15 to transistor N3 (FIG. 1). The gates of transistors P15 and N8 are connected to terminal 14. The wells of transistors P14 and P15 are connected to terminal 6, that is, they can, for example, be made in the same well.

As soon as transistor P14 is on, the structure formed of transistors P15 and N8 inverts the state of terminal 14 to provide it to terminal 15.

According to the present invention, the gate of transistor P14 receives signal Rd by being connected to terminal 51, to turn on transistor P14 only when signal Rd is low, that is, during programming cycles.

Two N-channel MOS transistors N9 and N10 respectively connect terminals 14 and 15 to ground 7. Their gates are controlled by signal Rd by being connected to terminal 51. Thus, when signal Rd is high, transistors N9 and N10 are on, which forces the states of terminals 14 and 15 to the ground. When signal Rd is low, transistors N9 and N10 are off, letting the inverter (P15, N8) operate.

An advantage of the present invention is that it enables forming, in CMOS technology, a structure of OTP memory cells based on oxide capacitors, the thicknesses of which are compatible with the gate oxides of the conventional CMOS method.

Another advantage of the present invention is that it enables performing both the programming and the reading of the differential cell by means of a same circuit. Thus, the present invention minimizes the general bulk required to form such a differential memory structure.

Of course, the present invention is likely to have various alterations, modifications, and improvements which will readily occur to those skilled in the art. In particular, the respective sizing of the different transistors will be chosen by those skilled in the art according to the application and, in particular, according to the necessary currents and voltages.

Further, the choice between the first or the second embodiment of the programming and read circuit is within the abilities of those skilled in the art based on the functional indications given hereabove and on the compromise desired for the considered application. In particular, the generation of the control signals is within the abilities of those skilled in the art.

Further, although reference has been made in the foregoing description to a circuit made from a P-type substrate, the present invention also applies to an N-type substrate. Transposing the present invention to an integrated circuit formed in such a substrate is within the abilities of those skilled in the art based on the functional indications given hereabove by inverting all conductivity types. Thus, the N-channel transistors are made in P-type wells and have their respective wells connected to their respective sources, and the P-channel transistors, which are one per branch, are unbalanced.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An OTP memory integrated circuit in CMOS technology, comprising:

at least two oxide capacitors forming a storage element configured for differential reading, one of the two capacitors being connected, via an unbalanced read transistor to an output stage; and a read and programming circuit coupled to the storage element and having transistors of a first conductivity type adapted for use during read cycles under a relatively low voltage and during programming cycles under a relatively high voltage, the unbalanced read transistor being of a second conductivity type and turned on only during read cycles.

2. The circuit of claim 1, wherein the programming and read circuit includes at least two unbalanced programming transistors of the second conductivity type, the respective drains of which are connected to a first terminal of the capacitors, respectively.

3. The circuit of claim 2, wherein the programming transistors are, each, associated in series with at least two transistors of the first conductivity type to form at least two first parallel branches between a first supply terminal and the ground, the source of an upper transistor of each branch being connected to the first supply terminal.

4. The circuit of claim 3, wherein a second transistor of the first conductivity type of each branch, interposed between a first transistor and the programming transistor, is connected to a terminal that receives an application of an intermediary voltage that is smaller than the voltage applied on the first supply terminal.

5. The circuit of claim 4, wherein the programming and read circuit includes at least two parallel secondary branches, each including, in series between the terminal that receives the application of the intermediary voltage and the ground, at least two transistors of the first conductivity type and one unbalanced programming transistor of the second conductivity type, said first branches including, each, at least three transistors of the first conductivity type.

6. The circuit of claim 2, wherein the programming transistors are off during read cycles.

7. The circuit of claim 2, wherein the programming transistors are controlled by complementary signals during a programming cycle.

* * * * *